United States Patent
Yamane

(10) Patent No.: US 11,211,541 B2
(45) Date of Patent: Dec. 28, 2021

(54) SUPERCONDUCTING ELEMENT, PARTICLE DETECTION DEVICE, AND PARTICLE DETECTION METHOD

(71) Applicant: TOSHIBA MEMORY CORPORATION, Tokyo (JP)

(72) Inventor: Takeshi Yamane, Tsukuba Ibaraki (JP)

(73) Assignee: TOSHIBA MEMORY CORPORATION, Tokyo (JP)

( * ) Notice: Subject to any disclaimer, the term of this patent is extended or adjusted under 35 U.S.C. 154(b) by 356 days.

(21) Appl. No.: 16/459,777

(22) Filed: Jul. 2, 2019

(65) Prior Publication Data
US 2020/0013943 A1 Jan. 9, 2020

(30) Foreign Application Priority Data
Jul. 4, 2018 (JP) .............................. JP2018-127830

(51) Int. Cl.
*H01L 39/12* (2006.01)
*G01J 1/44* (2006.01)

(52) U.S. Cl.
CPC ............... *H01L 39/12* (2013.01); *G01J 1/44* (2013.01); *G01J 2001/442* (2013.01); *G01J 2001/4446* (2013.01)

(58) Field of Classification Search
CPC ......... H01L 39/12; H01L 39/10; H01L 39/16; G01J 1/44; G01J 2001/4446; G01J 2001/442; G01K 7/006
See application file for complete search history.

(56) References Cited

U.S. PATENT DOCUMENTS

| 6,812,464 | B1 | 11/2004 | Sobolewski et al. |
| 10,505,094 | B2 * | 12/2019 | Sunter ........................ G01J 1/42 |
| 10,962,657 | B2 * | 3/2021 | Yamane .................... G01T 1/16 |
| 2018/0188107 | A1 | 7/2018 | Zen et al. |

FOREIGN PATENT DOCUMENTS

| JP | 5027965 B2 | 9/2012 |
| JP | 2017-9372 A | 1/2017 |

OTHER PUBLICATIONS

Fukuda et al., "Superconducting Single Photon Detectors," The Journal of the Institute of Electronics, Information and Communication Engineers (Aug. 2007), 90:674-679.

Inderbitzin et al., "Soft X-Ray Single-Photon Detection With Superconducting Tantalum Nitride and Niobium Nanowires," IEEE Transactions on Applied Superconductivity (Dec. 12, 2012), 23:1-5.

* cited by examiner

*Primary Examiner* — Seung C Sohn
(74) *Attorney, Agent, or Firm* — Finnegan, Henderson, Farabow, Garrett & Dunner L.L.P.

(57) ABSTRACT

According to one embodiment, a superconducting element used as a pixel for detecting a particle is disclosed. The superconducting element includes at least one superconducting strip. The at least one superconducting strip includes a superconducting portion extending in a first direction, including first and second ends and made of a first superconducting material, a first conductive portion connected to the first end of the superconducting portion, and a second conductive portion connected to the second end of the superconducting portion. A superconducting region of the superconducting portion is configured to be dived when the particle is made incident on the superconducting portion along the first direction via the first conductive portion.

20 Claims, 5 Drawing Sheets

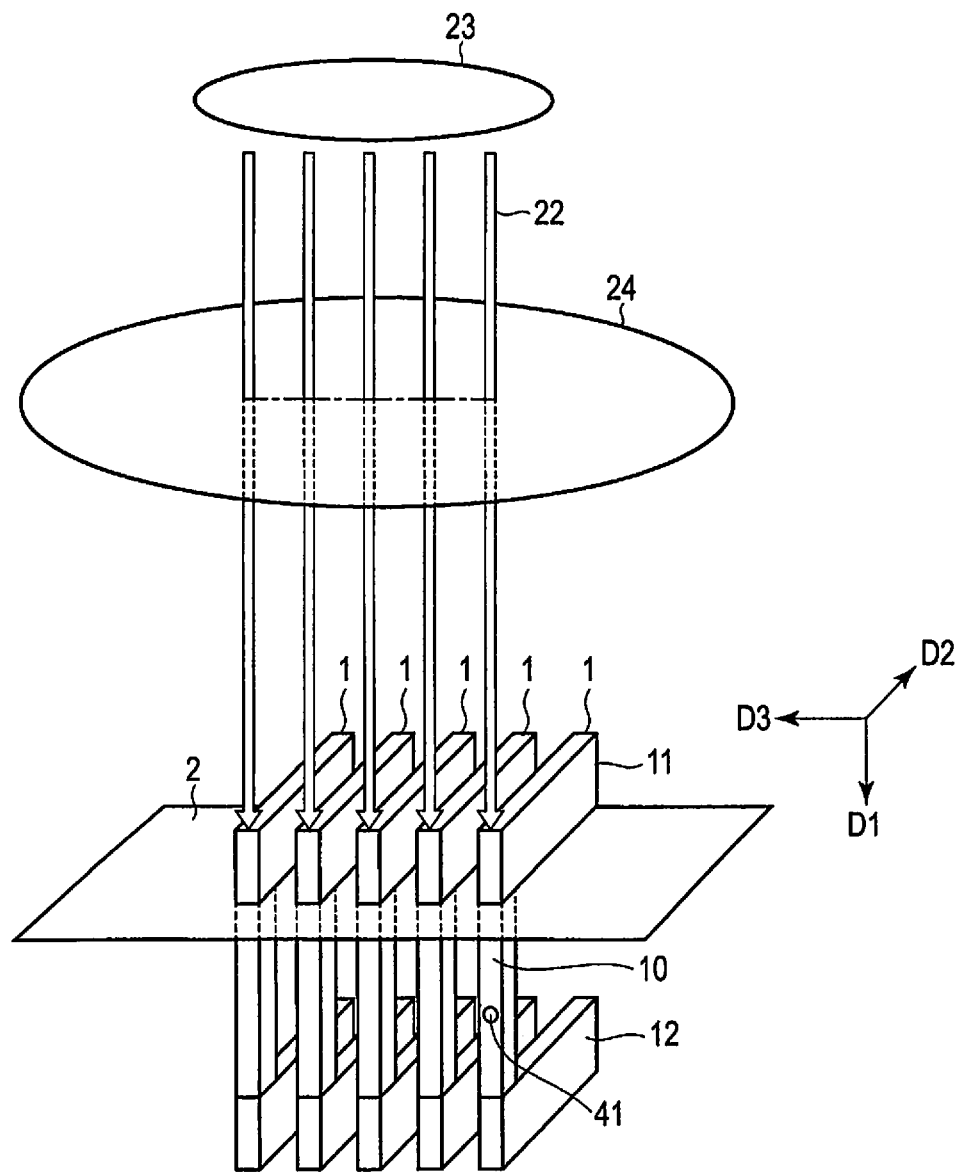
F I G. 1

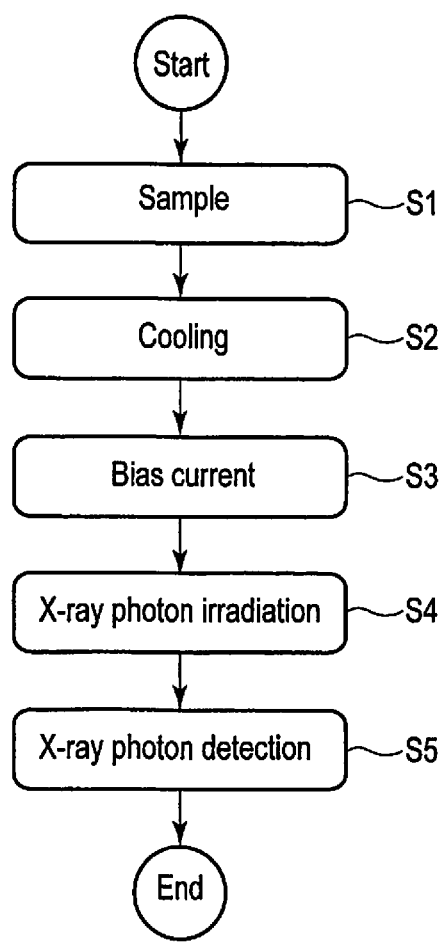
F I G. 8

SUPERCONDUCTING ELEMENT, PARTICLE DETECTION DEVICE, AND PARTICLE DETECTION METHOD

CROSS-REFERENCE TO RELATED APPLICATIONS

This application is based upon and claims the benefit of priority from Japanese Patent Application No. 2018-127830, filed Jul. 4, 2018, the entire contents of which are incorporated herein by reference.

FIELD

Embodiments described herein relate generally to a superconducting element, a particle detection device, and a particle detection method.

BACKGROUND

An X-ray photon detection device employing a narrow strip made of a superconducting material (superconducting strip) has been known. When detecting an X-ray photon, a bias current is supplied to the superconducting strip in a superconducting state. When the X-ray photon collides with the superconducting strip in this state, a temporal transition to a non-superconducting state arises in the vicinity of a region with which the X-ray photon collides, and thus a pulsed electrical signal generates. The pulsed electrical signal is detected to count the number of X-ray photons.

BRIEF DESCRIPTION OF THE DRAWINGS

FIG. 1 is a perspective view showing a schematic structure of a particle detection device according to a first embodiment.

FIG. 8 is a flow chart for explaining a detection method of an X-ray photon according to an embodiment.

DETAILED DESCRIPTION

Figure 2:
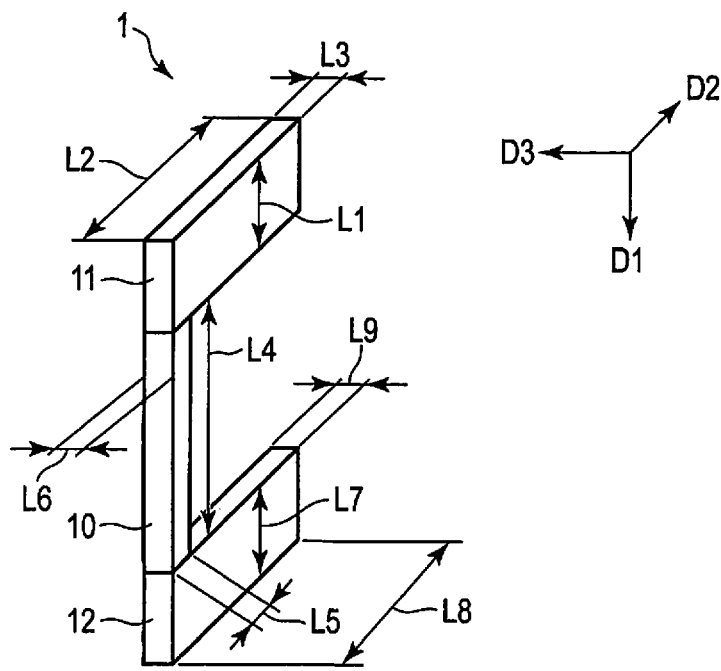
FIG. 2 is a diagram for explaining dimensions of a superconducting strip.

In general, according to one embodiment, a superconducting element used as a pixel for detecting a particle is disclosed. The superconducting element includes at least one superconducting strip. The at least one superconducting strip includes a superconducting portion extending in a first direction, including first and second ends and made of a first superconducting material, a first conductive portion connected to the first end of the superconducting portion, and a second conductive portion connected to the second end of the superconducting portion. A superconducting region of the superconducting portion is configured to be divided when the particle is incident on the superconducting portion along the first direction via the first conductive portion.

Embodiments will be described hereinafter with reference to the accompanying drawings. The drawings are schematic or conceptual drawings, and dimensions and ratios are not necessarily the same as those in reality. Further, in the drawings, the same reference symbols (including those having different subscripts) denote the same or corresponding parts, and overlapping explanations thereof will be made as necessary. In addition, as used in the description and the appended claims, what is expressed by a singular form shall include the meaning of "more than one".

First Embodiment

FIG. 1 is a perspective view showing a schematic structure of a particle detection device according to a first embodiment. In the present embodiment, description is given for a case where the particle detection device detects an X-ray photon, which is an example of a particle.

The particle detection device of the present embodiment comprises a plurality of superconducting strips 1 (superconducting elements) on which the X-ray photon is incident. Each of the superconducting strips 1 includes a superconducting portion 10 extending in a first direction D1, including first and second ends and made of a superconducting material, a first conducive portion 11 connected to the first end (upper end) of the superconducting portion 10 and made of a superconducting material, and a second conductive portion 12 connected to the second end (lower end) of the superconducting portion 10 and made of a superconducting material.

An X-ray photon is incident on the superconducting portion 10 along the first direction D1 via the first conductive portion 11. The X-ray photon moves along the first direction D1 in the superconducting portion 10, and the X-ray photon is absorbed and disappears in the superconducting portion 10.

In FIG. 1, reference symbol 2 represents the surface (substrate surface) of a substrate (not shown), and the substrate surface 2 corresponds to a detection surface. The superconducting portion 10 is perpendicular to the substrate surface 2, and extends in the first direction D1. The first conductive portion 11 and the second conductive portion 12 have the shape of a rectangular parallelepiped extending in a second direction D2 perpendicular to the first direction D1 as shown in FIG. 1. The superconducting strips 1 are arranged at an optional pitch P1 in a third direction D3 perpendicular to the first direction D1 and the second direction D2 without contacting each other.

In the present embodiment, the superconducting material of the superconducting portion 10, the superconducting material of the first conductive portion 11, and the superconducting material of the second conductive portion 12 are the same, and thus, the superconducting strips 1 are easily manufactured.

Note that, the superconducting portion 10 of the superconducting strip 1 is mainly used for detecting the X-ray photon, and thus other portions except the superconducting portion 10 of the superconducting strip 1 may include non-superconducting materials as long as the superconducting portion 10 includes the superconducting material. In the present specification, the superconducting strip 1 is that which uses the superconducting material for the superconducting portion 10.

Here, the cross sectional area of the superconducting portion 10 is small to the extent that a superconducting region is divided, and the cross sectional areas of the first conductive portion 11 and the second conductive portion 12 are large to the extent that superconducting regions are not divided. It has been known that if the cross sectional area of a superconducting nano-strip is large, a superconducting region is not divided, and as a result, the portions other than the superconducting portion 10 of the superconducting strip 1 can avoid detecting the X-ray.

The dimensions of the superconducting portion 10, the first conductive portion 11, and the second conductive portion 12 will be further described hereinafter with reference to FIG. 2.

In FIG. 2, reference symbols L1, L2, and L3 represent a dimension in the first direction D1, a dimension in the second direction D2, and a dimension in the third direction D3 of the first conductive portion 11, respectively.

In addition, reference symbols L4, L5, and L6 represent a dimension in the first direction D1, a dimension in the second direction D2, and a dimension in the third direction D3 of the superconducting portion 10, respectively.

Further, reference symbols L7, L8, and L9 represent a dimension in the first direction D1, a dimension in the second direction D2, and a dimension in the third direction D3 of the second conductive portion 12, respectively.

In the present embodiment, the dimensions L1, L2, and L3 of the first conductive portion 11 are equal to the dimensions L7, L8, and L9 of the second conductive portion 12, respectively. In addition, in the present embodiment, the dimension L3 of the first conductive portion 11, the dimension L6 of the superconducting portion 10, and the dimension L9 of the second conductive portion 12 are equal to each other. Further, the dimension L1 of the first conductive portion 11 is greater than the dimension L5 of the superconducting portion 10. The dimension L7 of the second conductive portion 12 is greater than the dimension L5 of the superconducting portion 10.

The dimension L5 of the superconducting portion 10 is less than or equal to 200 nm, and the dimension L6 of the superconducting portion 10 is less than or equal to 200 nm. This is because the cross sectional area (L5×L6) of the superconducting portion 10 is made smaller to the extent that the superconducting region is divided.

The dimension L1 of the first conductive portion 11 is greater than 200 nm. This is because the cross sectional area (L1×L3) of the first conductive portion 11 is made greater to the extent that the superconducting region is not divided. For the same reason, the dimension L7 of the second conductive portion 12 is greater than 200 nm.

The dimension L1 to the dimension L9 can be changed as appropriate to the extent that the superconducting region is divided in the superconducting portion 10 and the superconducting regions are not divided in the first conductive portion 11 and the second conductive portion 12.

Although FIG. 1 shows the five superconducting strips 1, two, three, four, six, or more superconducting strips 1 may be employed.

A well-known material can be selected as appropriate as the material of the superconducting portion 10. As in the case of a material including tantalum, the greater the absorptance of X-rays is, the greater the detection efficiency of X-ray photons is.

In the substrate under the substrate surface 2, an insulator (not shown) such as silicon dioxide is provided between the superconducting strips 1.

Referring to FIG. 1 again, the particle detection device further comprises an X-ray generator 23 that is disposed above superconducting strips 1 (in a direction opposite to the first direction D1) and generates X-rays 22. It should be noted that the X-ray generator 23 may not be included as a part of the particle detection device. In this case, when detecting the X-ray photon, the X-ray generator 23 is prepared separately from the particle detection device.

Figure 3:
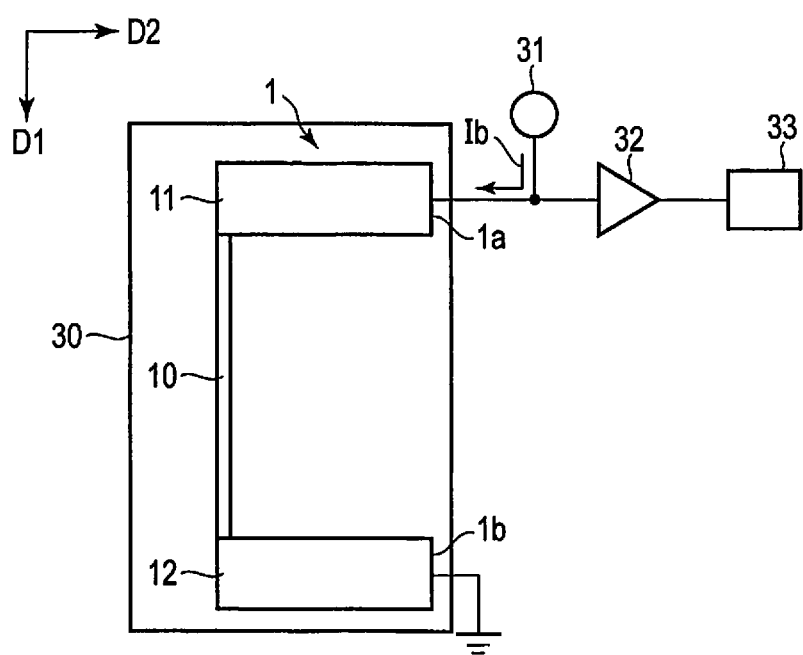
FIG. 3 is a diagram schematically showing a current source, an amplifier, and a measuring instrument connected to the superconducting strip of the particle detection device.

As shown in FIG. 3, the particle detection device further comprises a current source 31 connected to one end 1a of the superconducting strip 1. The current source 31 supplies a bias current Ib to the superconducting portion 10 via the first conductive portion 11. The bias current Ib is smaller than the critical current of the superconducting material of the superconducting portion 10. The other end 1b of the superconducting strip 1 is connected to ground. It should be noted that the current source 31 may not be included as a part of the particle detection device. In this case, when detecting the X-ray photon, the current source 31 is prepared separately from the particle detection device. Note that, in FIG. 3, reference symbol 30 represents the refrigerator described above.

The particle detection device further comprises an amplifier 32 connected to the one end 1a of the superconducting strip 1. The amplifier 32 amplifies an electrical signal generated in the superconducting portion 10. It should be noted that the amplifier 32 may not be included as a part of the particle detection device. In this case, when detecting the X-ray photon, the amplifier 32 is prepared separately from the particle detection device.

The particle detection device further comprises a measuring instrument 33 for monitoring the electrical signal, which is connected to the amplifier 32. More details are as follows.

When the X-ray photon is absorbed by the superconducting portion 10 in the superconducting state, which is cooled down to a critical temperature or less, the superconducting region of the superconducting portion 10 is divided. Thus, detecting the state in which the superconducting region is divided (divided state) corresponds to detecting the X-ray photon. Here, when the divided state arises, the superconducting portion 10 generates an electrical signal (for example, a pulsed electrical signal). Accordingly, the X-ray photon can be detected by detecting the electrical signal by using the measuring instrument 33.

It should be noted that the measuring instrument 33 may not be included as a part of the particle detection device. In this case, when detecting the X-ray photon, the measuring instrument 33 is prepared separately from the particle detection device.

The superconducting strips 1 are cooled down to the critical temperature or less by an optional refrigerator (not shown) so as to maintain the superconducting state. The refrigerator may not be included in the particle detection device as in the case of the current source 31, the amplifier 32, etc.

Next, a method of detecting the X-ray photon using the particle detection device of the present embodiment will be described with reference to a flow chart of FIG. 8.

As shown in FIG. 1, a sample 24 (for example, a semiconductor device) is disposed between the X-ray generator 23 and the superconducting strips 1 (step S1). Next, the superconducting strips 1 are cooled by the refrigerator to set the superconducting strips 1 into a superconducting state (step S2). Next, the bias current Ib is supplied to the superconducting portion 10 from the first conductive portion 11 (step S3), and in this state, the sample 24 is irradiated with the X-ray 22 generated by the X-ray generator 23, and a X-ray photon of the X-ray 22 penetrates the sample 24. Thereby causing the X-ray photon to be incident on the superconducting portion 10 along the first direction D1 via the first conductive portion 11. The substrate surface 2 is usually perpendicular to the direction of incidence of a chief ray generated by the X-ray generator 23. The bias current Ib is set to the extent that it is slightly less than the critical current, with which the superconducting state of the superconducting portion 10 is maintained.

Figure 4:
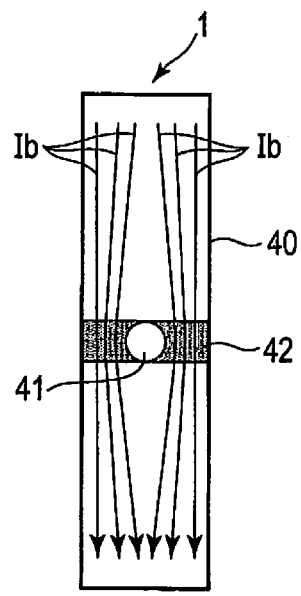
FIG. 4 is a diagram showing division of a superconducting region of the superconducting strip.

Since the dimension L5 and the dimension L6 of the superconducting portion 10 are less than or equal to 200 nm, the cross sectional area (L5×L6) of the superconducting portion 10 is small. Thus, when X-ray photon is absorbed in the superconducting portion 10, as shown in FIG. 4, a region called as the hot spot (hereinafter referred as a hot spot region) 41, which transitions to a non-superconducting state, is generated in a superconducting region 40 of the superconducting portion 10. The hot spot region 41 is also shown in FIG. 1. Since the electrical resistance of the hot spot region 41 increases, the bias current Ib bypasses the hot spot region 41 and flows through another region (bypass region) 42 as shown in FIG. 4. When a current greater than the critical current flows through the bypass region 42, the bypass region 42 transitions to a non-superconducting state and the superconducting region 40 is divided. Therefore, when the X-ray photon is incident on the superconducting portion 10, a state (divided state) in which the superconducting region of the superconducting portion 10 is divided arises (step S4).

Then, the hot spot region 41 which have transitioned to the non-superconducting state and the bypass region 42 rapidly disappear by being cooled, and thus, the pulsed electrical signal is generated by temporary electrical resistance generated by the division of the superconducting region 40. The pulsed electrical signal is amplified by the amplifier 32, and the number of X-ray photons (hereinafter, referred to as the X-ray photon number) is detected by counting the amplified pulsed electrical signal by using the measuring instrument 33 (step S5). Thus, the superconducting strip 1 can be used as a pixel for detecting the X-ray photon number.

Here, since the X-ray photon moves along the first direction D1 in the superconducting portion 10, the absorption of the X-ray photon in the superconducting portion 10 can be determined by the dimension L4 of the superconducting portion 10. Thus, the particle detection device of the present embodiment is improved in the detection efficiency of the X-ray photon by setting the dimension L4 greater than or equal to a predetermined value. Note that, to form the superconducting portion 10 accurately while improving the detection efficiency, it is appropriate that the dimension L3 be, for example, less than or equal to 3 µm.

The particle detection device of the present embodiment comprises the structure in which the superconducting strips 1 are arranged at the optional pitch P1 in the third direction D3, so that a one-dimensional profile of the X-ray photon number can be acquired. The sample 24 can be evaluated on the basis of the one-dimensional profile. In addition, if the pitch P1 is made smaller, for example, if the pitch P1 is set to 100 nm, the size of the pixel can be set to a small value of 100 nm.

In this manner, according to the present embodiment, it is possible to achieve the superconducting strip, the particle detection device, and the particle detection method that are capable of improving the detection efficiency and reducing the size of the pixel.

Note that, while the superconducting materials constituting the first conductive portion 11, the second conductive portion 12, and the superconducting portion 10 are the same in the present embodiment, the superconducting materials constituting the first conductive portion 11 and the second conductive portion 12 may be different from the superconducting material constituting the superconducting portion 10. For example, the materials of the first conductive portion 11 and the second conductive portion 12 may be superconducting materials whose critical temperature is higher than that of the superconducting material of the superconducting portion 10. In this case, the cross sectional areas of the first conductive portion 11 and the second conductive portion 12 can be made smaller.

In addition, the materials of the first conductive portion 11 and the second conductive portion 12 may be sufficiently high conductive materials (for example, gold) that are in the non-superconducting state at the cooling temperature at which the superconducting portions 10 are in the superconducting state. In this case, there are no restrictions on the cross sectional area of the first conductive portion 11 and the cross sectional area of the second conductive portion 12.

Figure 5:
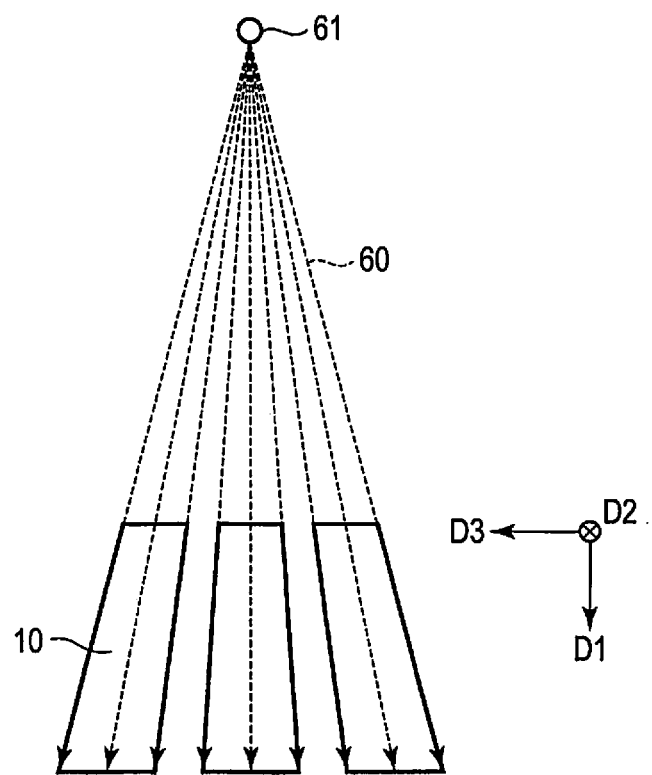
FIG. 5 is a diagram for explaining a modified example of the superconducting strips of the embodiment.

When the direction of incident X-ray photons 60 is radial as shown in FIG. 5, the detection efficiency can be further improved by setting a side in the first direction D1 of the superconducting portion 10 in a direction along the incident X-ray photons. Note that, reference symbol 61 represents an electromagnetic-wave generator that generates electromagnetic waves such as X-rays.

Figure 6:
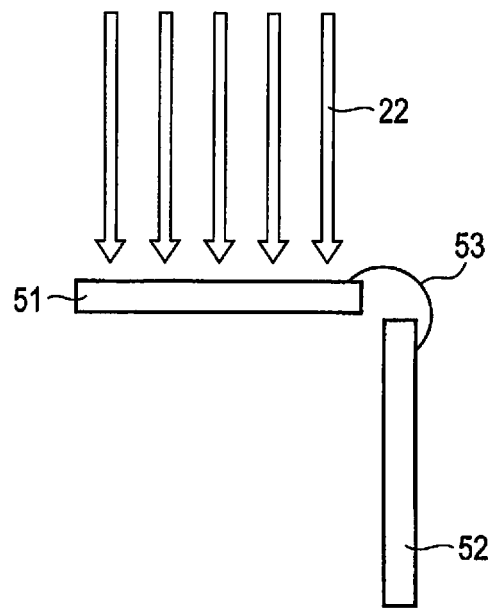
FIG. 6 is a diagram showing a positional relationship between a substrate having formed thereon the superconducting strips and a substrate having formed thereon a counter circuit.

A counter circuit that counts the pulsed electrical signals (for example, a circuit including the amplifier 32 and the measuring instrument 33 of FIG. 3) may be formed on a substrate on which the superconducting strips 1 are formed, or the counter circuit may be formed on a substrate 52 other than the substrate 51 on which the superconducting strips 1 are formed as shown in FIG. 6. In this case, the substrate 51 and the substrate 52 are electrically connected by using a connecting member 53 such as a wire bonding.

Here, in order to reduce the influence of X-rays on the substrate 52 (counter circuit), the substrate 51 and the substrate 52 are disposed so that the X-rays 22 are radiated to the substrate 51, while the X-rays 22 are not radiated to the substrate 52. In FIG. 6, the substrate 52 is disposed outside the substrate 51.

Second Embodiment

Figure 7:
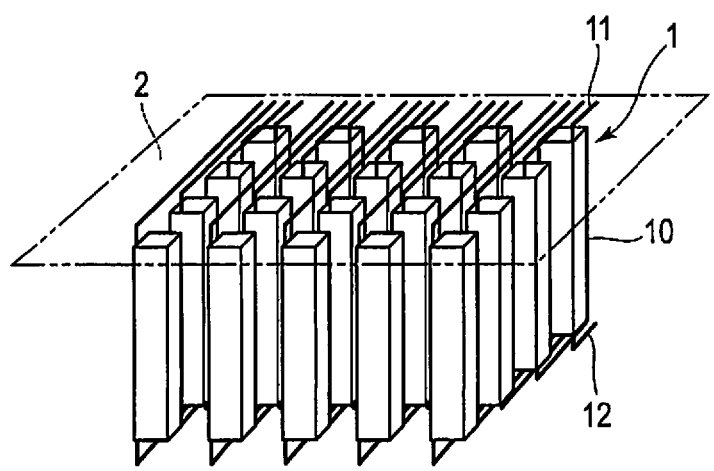
FIG. 7 is a perspective view showing a schematic structure of a particle detection device according to a second embodiment.

FIG. 7 is a perspective view showing the schematic structure of a particle detection device according to a second embodiment. Note that, in FIG. 7, a sample and an X-ray light source are omitted for the sake of simplification.

In the particle detection device of the present embodiment, the superconducting strips 1 are two-dimensionally arranged in a second direction D2 and a third direction D3 without contacting each other. Thus, with the particle detection device of the present embodiment, a two-dimensional profile of the X-ray photon number can be acquired.

In the present embodiment, a first conductive portion 11 and a second conductive portion 12 are disposed so as to be electrically insulated from superconducting portions 10 by an insulator (not shown). Thus, the width of the first conductive portion 11 (corresponding to L3 of FIG. 2) and the width of the second conductive portion 12 (corresponding to L9 of FIG. 2) of the present embodiment are smaller than those of the first embodiment. Accordingly, in the present embodiment, superconducting materials whose critical temperature is higher than that of the superconducting materials of the superconducting parts 10, or sufficiently high conductive materials (for example, gold) that are in the non-superconducting state at the cooling temperature at which the superconducting portions 10 is in the superconducting state, is used as the materials of the first conductive portion 11 and the second conductive portion 12.

In addition, while a plurality of superconducting strips are used to acquire a one-dimensional profile of the X-ray photon number in the particle detection devices of the above-described embodiments, the number of superconducting strips may be one depending on the purpose of the use of the particle detection devices.

While the superconducting strip, the particle detection device, and the particle detection method for detecting X-ray photons have been described in the above-described embodiments, the above-described embodiments are also applicable to the detection of other particles. For example, the above-described embodiments are also applicable to the detection of particles, such as extreme ultraviolet (EUV) photons, ultraviolet photons, infrared photons, visible light photons, electrons, neutrons, and ions.

In addition, the superconducting element is the superconducting stripes for detecting particle in the above-described embodiments, the superconducting element may be used for other applications. In the present disclosure, the superconducting element is one that includes a superconducting portion configured to generate a division of a superconducting region.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A superconducting element which is used as a pixel for detecting a particle, the superconducting element comprising at least one superconducting strip,
the at least one superconducting strip comprising:
a superconducting portion extending in a first direction, including first and second ends and made of a first superconducting material;
a first conductive portion connected to the first end of the superconducting portion; and
a second conductive portion connected to the second end of the superconducting portion,
wherein a superconducting region of the superconducting portion is configured to be divided when the particle is incident on the superconducting portion along the first direction via the first conductive portion.

2. The superconducting element of claim 1, wherein the at least one superconducting strip is a plurality of superconducting strips.

3. The superconducting element of claim 2, wherein:
the first conductive portion and the second conductive portion are made of the first superconducting material, and
a dimension in the first direction of the first conductive portion and a dimension in the first direction of the second conductive portion are greater than a dimension in a second direction perpendicular to the first direction of the superconducting portion.

4. The superconducting element of claim 3, wherein:
the dimension in the second direction perpendicular to the first direction of the superconducting portion is less than or equal to 200 nm, and
a dimension in a third direction perpendicular to the first direction and the second direction of the superconducting portion is less than or equal to 200 nm.

5. The superconducting element of claim 4, wherein the dimension in the first direction of the first conductive portion and the dimension in the first direction of the second conductive portion are greater than 200 nm.

6. The superconducting element of claim 1, wherein the first conductive portion is made of a second superconducting material which is different from the first superconducting material.

7. The superconducting element of claim 6, wherein a critical temperature of the second superconducting material is higher than a critical temperature of the first superconducting material.

8. The superconducting element of claim 4, wherein the plurality of superconducting strips are arranged in the third direction without contacting each other.

9. The superconducting element of claim 4, wherein the plurality of superconducting strips are two-dimensionally arranged in the second direction and the third direction without contacting each other.

10. The superconducting element of claim 1, wherein the particle includes an X-ray photon, an extreme ultraviolet photon, an ultraviolet photon, an infrared photon, a visible light photon, an electron, a neutron, or an ion.

11. A particle detection device comprising:
a superconducting element used as a pixel for detecting a particle and comprising at least one superconducting strip; and
a current source which supplies a bias current to the at least one superconducting strip, and
the at least one superconducting strip comprising:
a superconducting portion extending in a first direction, including first and second ends and made of a first superconducting material;
a first conductive portion connected to the first end of the superconducting portion; and
a second conductive portion connected to the second end of the superconducting portion,
wherein a superconducting region of the superconducting portion is configured to be dived when the particle is incident on the superconducting portion along the first direction via the first conductive portion.

12. The particle detection device of claim 11, wherein the at least one superconducting strip is a plurality of superconducting strips.

13. The particle detection device of claim 11, wherein the bias current is smaller than a critical current of the first superconducting material.

14. The particle detection device of claim 11, further comprising a measuring instrument which detects the particle based on a state in which the superconducting region of the superconducting portion is divided, and wherein the state arises in the at least one superconducting strip.

15. The particle detection device of claim 11, further comprising a refrigerator which cools the at least one superconducting strip and maintains a superconducting state.

16. A particle detection method employing a superconducting element comprising at least one superconducting strip, each of the at least one superconducting strip comprising a superconducting portion extending in a first direction, including first and second ends and made of a first superconducting material, a first conductive portion connected to the first end of the superconducting portion, and a second conductive portion connected to the second end of the superconducting portion, the particle detection method comprising:

cooling the at least one superconducting strip to set the at least one superconducting strip into a superconducting state;

supplying a bias current to the superconducting portion from the first conductive portion; and causing a particle to be incident on the superconducting portion along the first direction via the first conductive portion to set a superconducting region of the superconducting portion into a divided state.

17. The particle detection method of claim 16, wherein before irradiating the superconducting portion with the particle, the particle penetrates a sample.

18. The particle detection method of claim 16, wherein the at least one superconducting strip is a plurality of superconducting strips.

19. The particle detection method of claim 16, wherein the bias current is smaller than a critical current of the first superconducting material.

20. The particle detection method of claim 16, wherein the particle includes any one of an X-ray photon, an extreme ultraviolet photon, an ultraviolet photon, an infrared photon, a visible light photon, an electron, a neutron, and an ion.

* * * * *